(12) United States Patent
Wang

(10) Patent No.: US 11,115,260 B2
(45) Date of Patent: Sep. 7, 2021

(54) SIGNAL COMPENSATION DEVICE

(71) Applicant: Realtek Semiconductor Corporation, Hsinchu (TW)

(72) Inventor: Wen-Shan Wang, Tainan (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 0 days.

(21) Appl. No.: 16/672,686

(22) Filed: Nov. 4, 2019

(65) Prior Publication Data

US 2020/0344108 A1    Oct. 29, 2020

(30) Foreign Application Priority Data

Apr. 23, 2019  (TW) ................. 108114192

(51) Int. Cl.
| | |
|---|---|
| *H04L 27/36* | (2006.01) |
| *H04B 17/11* | (2015.01) |
| *H04B 17/21* | (2015.01) |
| *H04L 27/00* | (2006.01) |
| *H04B 1/38* | (2015.01) |
| *H03F 3/217* | (2006.01) |
| *H03G 3/30* | (2006.01) |
| *H04L 27/26* | (2006.01) |

(52) U.S. Cl.
CPC ........ *H04L 27/366* (2013.01); *H03F 3/2175* (2013.01); *H03G 3/3042* (2013.01); *H03G 3/3078* (2013.01); *H04B 1/38* (2013.01); *H04B 17/11* (2015.01); *H04B 17/21* (2015.01); *H04L 27/0002* (2013.01); *H04L 27/2647* (2013.01)

(58) Field of Classification Search
CPC ............. H04L 27/366; H04L 27/0002; H04L 27/2647; H04L 27/367; H04L 27/368; H04L 1/24; H04L 1/242; H04L 1/243; H04B 17/11; H04B 17/21; H04B 1/38; H03F 3/2175; H03G 3/3042; H03G 3/3078
USPC .................................. 375/295–297
See application file for complete search history.

(56) References Cited

U.S. PATENT DOCUMENTS

| | | | | | |
|---|---|---|---|---|---|
| 5,353,309 | A | * | 10/1994 | Agazzi ............. | H04L 25/4919 341/143 |
| 5,524,286 | A | * | 6/1996 | Chiesa ............. | H03F 1/3247 330/149 |
| 6,834,183 | B2 | * | 12/2004 | Black ............... | H01Q 3/267 331/17 |
| 6,975,687 | B2 | * | 12/2005 | Jackson ............ | H03F 3/24 375/296 |

(Continued)

OTHER PUBLICATIONS

Keith Finnerty et al., "Cartesian Pre-distortion using a Sigma Delta Modulator for Multi-Standard RF Power Amplifiers", ISSC 2012, NUI Maynooth, Jun. 28-29.

*Primary Examiner* — James M Perez
(74) *Attorney, Agent, or Firm* — Locke Lord LLP; Tim Tingkang Xia, Esq.

(57) ABSTRACT

A signal compensation device is disclosed. The signal compensation device includes an operation circuit and a modulation circuit. The operation circuit is configured to generate a control signal according to a first data signal and a second data signal, in which the second data signal is generated according to the first data signal by a signal conversion circuit. The modulation circuit is configured to provide a loop gain according to the control signal to compensate an attenuation of the signal conversion circuit.

12 Claims, 3 Drawing Sheets

(56) References Cited

U.S. PATENT DOCUMENTS

| | | | | |
|---|---|---|---|---|
| 7,072,427 | B2* | 7/2006 | Rawlins | H04B 1/30 375/345 |
| 7,277,032 | B2* | 10/2007 | Lin | H03M 3/33 341/131 |
| 7,289,005 | B2* | 10/2007 | Puma | H03C 5/00 332/108 |
| 7,321,325 | B2* | 1/2008 | Hsieh | H03M 3/38 341/120 |
| 7,446,687 | B2* | 11/2008 | Lin | H03M 3/352 341/118 |
| 7,471,736 | B2* | 12/2008 | Ding | H03C 3/40 375/141 |
| 7,532,679 | B2* | 5/2009 | Staszewski | H03F 3/24 375/295 |
| 7,672,645 | B2* | 3/2010 | Kilpatrick | H04B 1/406 455/76 |
| 7,791,428 | B2* | 9/2010 | Chang | H03L 7/0991 332/123 |
| 8,170,507 | B2* | 5/2012 | Wang | H03F 3/72 455/114.3 |
| 8,208,872 | B2* | 6/2012 | Wang | H03F 1/3247 455/114.3 |
| 8,325,865 | B1* | 12/2012 | Rofougaran | H04B 1/0028 375/350 |
| 8,331,879 | B2* | 12/2012 | van Zelm | H03F 1/3247 455/114.3 |
| 8,340,214 | B2* | 12/2012 | Kang | H04L 25/03343 375/297 |
| 8,417,194 | B2* | 4/2013 | Huang | H03F 3/24 455/114.3 |
| 8,532,215 | B2* | 9/2013 | Huang | H04L 25/03343 375/267 |
| 8,665,938 | B2* | 3/2014 | Yu | H04W 24/10 375/228 |
| 8,736,475 | B1* | 5/2014 | Harrison | H03M 3/504 341/144 |
| 8,831,136 | B2* | 9/2014 | Ishikawa | H03F 1/3241 375/297 |
| 9,008,161 | B1* | 4/2015 | Chang | H04L 27/38 375/221 |
| 9,031,521 | B2* | 5/2015 | Yang | H03F 3/189 455/126 |
| 9,036,753 | B1* | 5/2015 | Chang | H04L 25/03261 375/350 |
| 9,088,319 | B2* | 7/2015 | Peng | H03F 1/3241 |
| 9,166,617 | B1* | 10/2015 | Beaulaton | H03M 3/502 |
| 9,190,974 | B2* | 11/2015 | Richt | H03G 3/3042 |
| 9,257,999 | B1* | 2/2016 | Vilhonen | H03L 7/104 |
| 9,276,602 | B1* | 3/2016 | Pagnanelli | H04L 27/362 |
| 9,312,892 | B2* | 4/2016 | Chang | H03F 3/24 |
| 9,344,096 | B2* | 5/2016 | Huang | H04B 10/60 |
| 9,344,108 | B2* | 5/2016 | Hampel | H03F 3/2171 |
| 9,438,177 | B2* | 9/2016 | Chang | H03F 1/3258 |
| 9,450,544 | B2* | 9/2016 | Chang | H03F 1/3258 |
| 9,455,737 | B1* | 9/2016 | Rajaee | H03M 3/464 |
| 9,595,982 | B2* | 3/2017 | Weber | H03F 1/3247 |
| 9,614,557 | B1* | 4/2017 | Mayer | H04B 1/40 |
| 9,685,983 | B2* | 6/2017 | Anantharaman Chandrasekarapuram | H04B 1/1027 |
| 9,912,348 | B1* | 3/2018 | Baringer | H03M 3/398 |
| 9,935,810 | B1* | 4/2018 | Hammier | H03F 1/3247 |
| 10,003,414 | B2* | 6/2018 | Casagrande | H03L 7/099 |
| 10,033,413 | B2* | 7/2018 | Pratt | H03F 1/3294 |
| 10,056,927 | B2* | 8/2018 | Gagey | H04B 1/1027 |
| 10,064,140 | B2* | 8/2018 | Lin | H04W 52/0261 |
| 10,110,247 | B1* | 10/2018 | Baringer | H04B 17/20 |
| 10,181,862 | B1* | 1/2019 | Marr | H03M 3/464 |
| 10,211,931 | B1* | 2/2019 | Wang | H04B 1/40 |
| 10,469,109 | B2* | 11/2019 | Gutman | H03F 3/24 |
| 10,498,372 | B2* | 12/2019 | Pratt | H04B 1/0475 |
| 10,622,951 | B1* | 4/2020 | Chen | H03F 3/21 |
| 2002/0160734 | A1* | 10/2002 | Li | H03G 3/3089 455/245.1 |
| 2005/0069050 | A1* | 3/2005 | Ding | H03C 3/40 375/296 |
| 2005/0163255 | A1* | 7/2005 | Pan | H04L 27/20 375/298 |
| 2005/0164657 | A1* | 7/2005 | Pan | H04B 1/0475 455/118 |
| 2005/0266805 | A1* | 12/2005 | Jensen | H03M 3/43 455/82 |
| 2006/0133532 | A1* | 6/2006 | Jensen | H04L 27/368 375/279 |
| 2008/0159435 | A1* | 7/2008 | Cohen | H03F 1/34 375/297 |
| 2010/0104043 | A1* | 4/2010 | Farrell | H03M 7/3006 375/296 |
| 2010/0127774 | A1* | 5/2010 | Wang | H03F 1/3247 330/149 |
| 2010/0188148 | A1* | 7/2010 | Mehta | H03F 1/3247 330/149 |
| 2011/0150130 | A1* | 6/2011 | Kenington | H03F 3/24 375/296 |
| 2011/0299576 | A1* | 12/2011 | Mikhemar | H04B 1/38 375/219 |
| 2011/0304390 | A1* | 12/2011 | Huang | H03F 1/3241 330/127 |
| 2012/0269291 | A1* | 10/2012 | Wang | H04B 1/0475 375/297 |
| 2012/0326904 | A1* | 12/2012 | Jensen | H03M 1/201 341/131 |
| 2013/0039394 | A1* | 2/2013 | Oliaei | H04B 1/0475 375/219 |
| 2013/0064319 | A1* | 3/2013 | Right | H03G 3/3042 375/268 |
| 2013/0099949 | A1* | 4/2013 | Wagner | H03M 3/368 341/143 |
| 2013/0177106 | A1* | 7/2013 | Levesque | H03F 3/195 375/297 |
| 2014/0191815 | A1* | 7/2014 | Mirzaei | H03L 7/06 331/1 A |
| 2015/0054585 | A1* | 2/2015 | Chang | H03F 1/3247 330/291 |
| 2015/0061911 | A1* | 3/2015 | Pagnanelli | H03M 3/358 341/144 |
| 2015/0280734 | A1* | 10/2015 | Si | H03M 3/322 341/143 |
| 2015/0372700 | A1* | 12/2015 | Talty | H04B 1/006 370/343 |
| 2016/0036472 | A1* | 2/2016 | Chang | H03F 1/3241 375/297 |
| 2016/0048707 | A1* | 2/2016 | Alladi | H03M 3/32 341/143 |
| 2016/0056764 | A1* | 2/2016 | Tham | H03D 7/165 327/355 |
| 2016/0182075 | A1* | 6/2016 | Devarajan | H03M 1/128 341/120 |
| 2016/0309274 | A1* | 10/2016 | Ma | H03F 3/21 |
| 2016/0315648 | A1* | 10/2016 | Talty | H04L 1/0071 |
| 2016/0337979 | A1* | 11/2016 | Talty | H04W 52/0274 |
| 2017/0077945 | A1* | 3/2017 | Pagnanelli | H03M 3/50 |
| 2017/0111188 | A1* | 4/2017 | Deng | H03F 3/245 |
| 2018/0145700 | A1* | 5/2018 | Yu | H03F 3/245 |
| 2019/0089389 | A1* | 3/2019 | Gutman | H03F 1/3247 |
| 2019/0346877 | A1* | 11/2019 | Allan | H03L 7/087 |
| 2020/0195489 | A1* | 6/2020 | Wang | H04L 27/3405 |
| 2020/0344108 | A1* | 10/2020 | Wang | H03G 3/3042 |

* cited by examiner

US 11,115,260 B2

SIGNAL COMPENSATION DEVICE

CROSS-REFERENCE TO RELATED APPLICATION

This application claims the priority benefit of TAIWAN Application serial no. 108114192, filed Apr. 23, 2019, the full disclosure of which is incorporated herein by reference.

FIELD OF INVENTION

The invention relates to a signal compensation device. More particularly, the invention relates to a signal compensation device with a modulation circuit.

BACKGROUND

The power amplifier (PA) in the signal transceiver is subject to amplitude modulation to amplitude modulation (AM-AM) distortion and amplitude modulation to phase modulation (AM-PM) distortion, resulting in spectral regeneration. Spectral regeneration makes it difficult to integrate power amplifiers into wireless transceiver s, such as IEEE 802.11 a/b/g/n/ac WLAN applications, and the performance of the transmitter is reduced. Many methods have been proposed to compensate for signal distortion. However, this has resulted in increased cost and design complexity of the transmitter.

SUMMARY

An aspect of this disclosure is to provide a signal compensation device including an operation circuit and a modulation circuit. The operation circuit is configured to generate a control signal according to a first data signal and a second data signal, in which the second data signal is generated according to the first data signal by a signal conversion circuit. The modulation circuit is configured to provide a loop gain according to the control signal to compensate an attenuation of the signal conversion circuit.

Embodiments of the present disclosure provide a signal compensation device. By using a modulation circuit to linearize the emitter and receiver. Compared to the existing signal compensation method, the embodiments of the present disclosure reduce the computational complexity and the power consumption is less.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
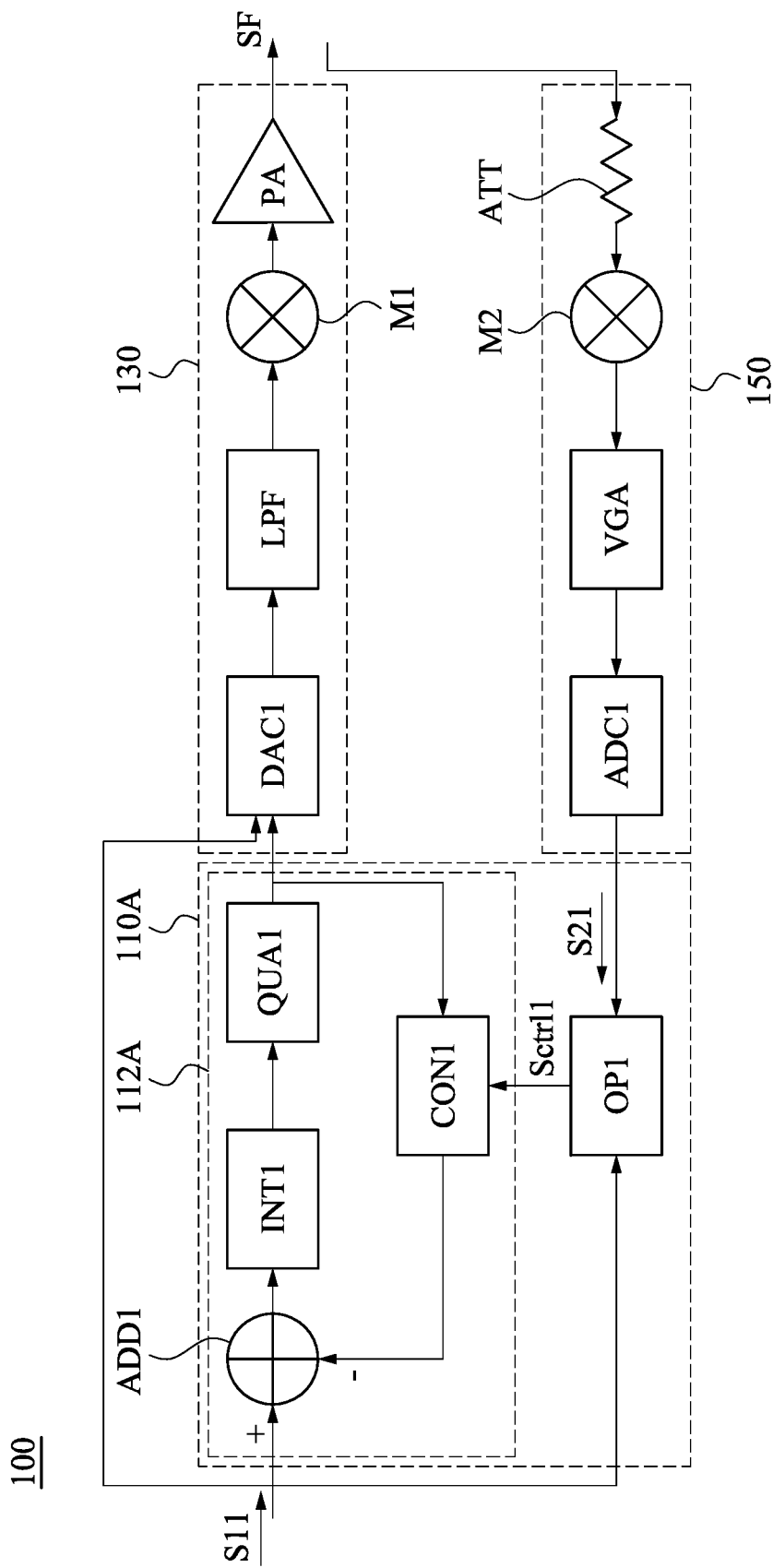
FIG. 1 is a schematic diagram illustrating a signal transceiver according to some embodiments of the present disclosure.

The following disclosure provides many different embodiments, or examples, for implementing different features of the invention. Specific examples of elements and arrangements are described lower than to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed.

The terms used in this specification generally have their ordinary meanings in the art, within the context of the invention, and in the specific context where each term is used. Certain terms that are used to describe the invention are discussed lower than, or elsewhere in the specification, to provide additional guidance to the practitioner regarding the description of the invention.

FIG. 1 is a schematic diagram illustrating a signal transceiver 100 according to some embodiments of the present disclosure. As illustrated in FIG. 1, the signal transceiver 100 includes the signal compensation device 110A, the transmitter conversion circuit 130, and the receiver conversion circuit 150. The signal compensation device 110A includes an operation circuit OP1 and a modulation circuit 112A. The transmitter conversion circuit 130 includes a digital to analog circuit DAC1, a low frequency filter circuit LPF, a mixing circuit M1, and an amplifying circuit PA. The receiver conversion circuit 150 includes an analog to digital circuit ADC1, a power amplifying circuit VGA, a mixing circuit M2, and an attenuation circuit ATT. The modulation circuit 112 includes an addition and subtraction operation circuit ADD1, an integration circuit INT1, a quantization circuit QUA1, and a control circuit CON1.

In the connection relationship, the addition and subtraction operation circuit ADD1 is coupled to the integration circuit INT1 and the control circuit CON1. The integration circuit INT1 is coupled to the quantization circuit QUA1. The quantization circuit QUA1 is coupled to the digital to analog circuit DAC1 and the control circuit CON1.

The digital to analog circuit DAC1 is coupled to the low frequency filter circuit LPF. The low frequency filter circuit LPF is coupled to the mixing circuit M1. The mixing circuit M1 is coupled to the amplifying circuit PA.

The attenuation circuit ATT is coupled to the mixing circuit M2. The mixing circuit M2 is coupled to the power amplifying circuit VGA. The power amplifying circuit VGA is coupled to the analog to digital circuit ADC1.

In the operation relationship, the operation circuit OP is configured to generate the control signal Sctrl1 according to the data signal S11 and the data signal S12, in which the data signal S12 is generated by the transmitter conversion circuit 130 and the receiver conversion circuit 150 according to the data signal S1.

When operating or obtaining a calibration model by the first time, the data signal S11 bypasses the modulation circuit 112A and is directly transmitted to the transmitter conversion circuit 130, and after the transmitter conversion circuit 130 converts the data signal S11, the emitter (not shown) transmits the emitting data signal SF. After the emitter (not shown) receives the emitting data signal SF and receiver conversion circuit 150 converts the emitting data signal SF, the data signal S21 is generated. After the operation circuit OP1 receives the data signal S11 and the data signal S21, the control signal Sctrl1 is generated according to the data signals S11 and S21. In some embodiments, the control signal Sctrl1 is generated by the data signal S21 divided by the data signal S11. Then, the control signal Sctrl1 is transmitted to the control circuit CON1 to be stored.

The modulation circuit 112A as illustrated in FIG. 1 is a sigma-delta modulation circuit. If the computing model of the integration circuit INT1 plus the quantization circuit QUA1 is H(s), the computing model of the control circuit CON1 is G(s), through the loop gain of the control circuit CON1, the computing model of the modulation circuit 112A is as following:

$$\frac{H(s)}{1 + H(s)G(s)} \approx \frac{1}{G(s)}$$

The modulation circuit 112A is not bypassed when the data signal S11 to be output is actually transmitted. Thus, after the data signal S11 passes through the signal compensation device 110A, the transmitter conversion circuit 130 and the receiver conversion circuit 150, the signal of the data signal S21 is close to the data signal S11 or the same as the data signal S11.

That is, the modulation circuit 112A provides a loop gain based on the control signal Sctrl1 to offset the attenuation of the signal conversion circuit (including the transmitter conversion circuit 130 and the receiver conversion circuit 150).

In some embodiments, digital to analog circuit DAC1 is configured to convert the received data signal from a digital data signal to an analog data signal, and the low pass filter circuit LPF filters the received analog data signal to generate a filtered data signal. The mixing circuit M1 is configured to convert the analog data signal from a low frequency signal to a high frequency signal. The amplifying circuit PA is configured to amplify the received high frequency signal to generate an emitting data signal SF.

In some embodiments, the attenuation circuit ATT is configured to attenuate the emitting data signal emitted by the emitter and the attenuated signal is generated. The mixing circuit M2 is configured to adjust the attenuated signal from high frequency to low frequency. The power amplifying circuit VGA is configured to amplify the attenuated signal to produce an analog data signal. The analog to digital circuit ADC1 is configured to convert the analog data signal into a digital data signal.

The signal compensation device 110A as shown in FIG. 1 is a pre-distortion modulation circuit. The modulation circuit 112A of the signal compensation device 110A is coupled to the transmitter conversion circuit 130. The data signal S11 is first modulated by the signal compensation device 110A, and then output after the attenuation of the transmitter conversion circuit 130.

Figure 2:
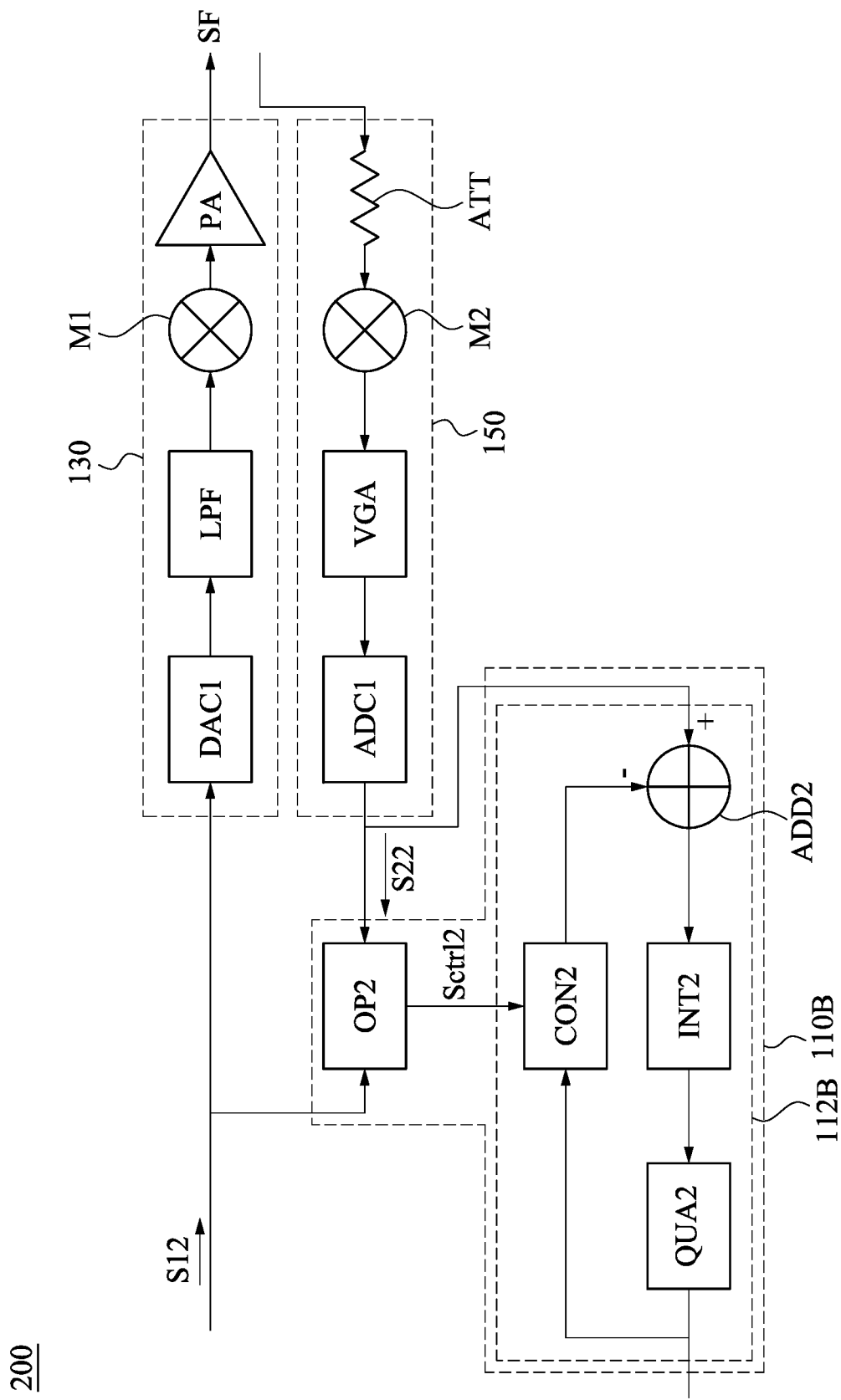
FIG. 2 is a schematic diagram illustrating a signal transceiver according to some embodiments of the present disclosure.

Reference is made to FIG. 2. FIG. 2 is a schematic diagram illustrating a signal transceiver 200 according to some embodiments of the present disclosure. The transmitter conversion circuit 130 and the receiver conversion circuit 150 in FIG. 2 are the same as the transmitter conversion circuit 130 and the receiver conversion circuit 150 in FIG. 1. The difference between the signal transceiver 200 in FIG. 2 and the signal transceiver 100 in FIG. 1 is that the modulation circuit 112B of the signal compensation device 110B in FIG. 2 is coupled to the receiver conversion circuit 150.

As illustrated in FIG. 2, when operating or obtaining a calibration model by the first time, after the transmitter conversion circuit 130 receives the data signal S12, the transmitter conversion circuit 130 generates the emitting data signal SF according to the data signal S12, and the emitting data signal SF is transmitted. After the receiver conversion circuit 150 receives the emitting data signal SF, the receiver conversion circuit 150 generates the data signal S22 according to the emitting data signal SF, and the data signal S22 is transmitted to the operation circuit OP2. The operation circuit OP2 generates a control signal Sctrl2 according to the data signal S22 and the data signal S12. Next, the control signal Sctrl2 is transmitted to the control circuit CON2 for storage. In some embodiments, the control signal Sctrl2 is generated by dividing the data signal S22 by the data signal S12.

When the data signal S12 to be output is actually transmitted, the signal generated by the data signal S12 via the transmitter conversion circuit 130 and the receiver conversion circuit 150 is transmitted to the signal compensation device 110B. The signal compensation device 110B provides a loop gain according to the control signal Sctrl2 to compensate for the attenuation of the signal conversion circuit (including the transmitter conversion circuit 130 and the receiver conversion circuit 150).

The signal compensation device 110B as shown in FIG. 2 is a post-distortion modulation circuit. The modulation circuit 112B of the signal compensation device 110B is coupled to the receiver conversion circuit 150. After the data signal S12 is output and after the attenuation of the transmitter conversion circuit 130 and the receiver conversion circuit 150, the compensation is corrected by the signal compensation device 110B.

Figures 3, 4, 5:
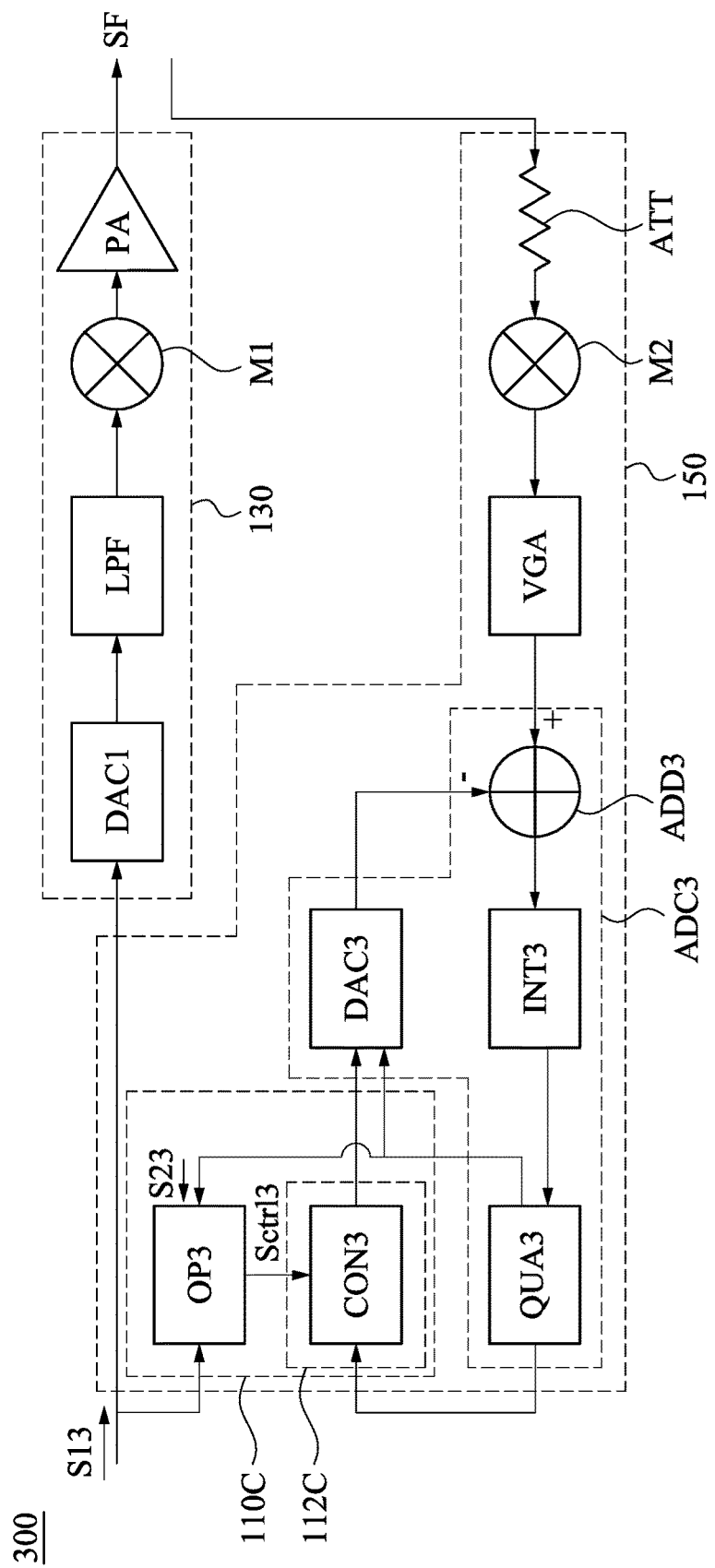
FIG. 3 is a schematic diagram illustrating a signal transceiver according to some embodiments of the present disclosure.
FIG. 4 is a schematic diagram illustrating an integration circuit according to some embodiments of the present disclosure.
FIG. 5 is a schematic diagram illustrating an integration circuit according to some embodiments of the present disclosure.

Reference is made to FIG. 3. FIG. 3 is a schematic diagram illustrating a signal transceiver 300 according to some embodiments of the present disclosure. The transmitter conversion circuit 130 in FIG. 3 is the same as the transmitter conversion circuit 130 in FIG. 1. The difference between the signal transceiver 300 in FIG. 3 and the signal transceiver 100 in FIG. 1 is that in FIG. 3, the signal compensation device 110C is located in the receiver conversion circuit 150. The signal compensation device 110C as shown in FIG. 3 is a post-distortion modulation circuit.

As illustrated in FIG. 3, the analog to digital circuit ADC3 of the receiver conversion circuit 150 includes the addition and subtraction operation circuit ADD3, the integration circuit INT3, the quantization circuit QUA3, and the digital to analog circuit DAC3. The signal compensation device 110C includes an operation circuit OP3 and a modulation circuit 112C. The modulation circuit 112C includes a control circuit CON3.

In the connection relationship, the addition and the subtraction operation circuit ADD3 are coupled to the integration circuit INT3. The integration circuit INT3 is coupled to the quantization circuit QUA3. The quantization circuit QUA3 is coupled to the control circuit CON3. The control circuit CON3 is coupled to the operation circuit OP3 and the digital to analog circuit DAC3.

When operating or obtaining a calibration model by the first time, after the transmitter conversion circuit 130 receives the data signal S13, the transmitter conversion circuit 130 generates the emitting data signal SF according to the data signal S13, and emits the emitting data signal SF.

After the receiver conversion circuit 150 receives the emitting data signal SF, when the quantization circuit QUA3 of the receiver conversion circuit 150 transmits the data signal the control circuit CON3 is bypassed, the data signal S23 processed by the attenuation circuit ATT, the mixing circuit M2, the power amplifying circuit VGA, the addition and subtraction operation circuit ADD3, the integration circuit INT3, and the quantization circuit QUA3 is directly transmitted to the digital to analog circuit DAC3 and the operation circuit OP3. The operation circuit OP3 generates a control signal Sctr3 according to the data signal S23 and the data signal S13. Next, the control signal Sctrl3 is transferred to the control circuit CON3 for storage. In some embodiments, the control signal Sctrl3 is generated by dividing the data signal S23 by the data signal S13.

When the data signal S13 to be output is actually transmitted, the data signal S13 is transmitted to the receiver conversion circuit 150 through the transmitter conversion circuit 130. When the receiver conversion circuit 150 is operated, the signal generated by the quantization circuit QUA3 is first transmitted to the control circuit CON3, and then transmitted to the digital to analog circuit DAC3 by the control circuit CON3.

In the embodiment of FIG. 3, the loop gain of the signal compensation device 110 is formed by the addition and subtraction operation circuit ADD3, the integration circuit INT3, the quantization circuit QUA3, the control circuit CON3, and the digital to analog circuit DAC3 to compensate the signal attenuation caused by the attenuation circuit ATT, the mixing circuit M2, the power amplifying circuit VGA, the addition and subtraction operation circuit ADD3, the integration circuit INT3, the quantization circuit QUA3, and the digital to analog circuit DAC3 of the transmitter conversion circuit 130 and the receiver conversion circuit 150.

Reference is made to FIG. 4 and FIG. 5. FIG. 4 is a schematic diagram illustrating an integration circuit INT$a$ according to some embodiments of the present disclosure. FIG. 5 is a schematic diagram illustrating an integration circuit INT$b$ according to some embodiments of the present disclosure. The integration circuit INT$a$ and the integration circuit INT$b$ may be configured to represent the integration circuit INT1 in FIG. 1, the integration circuit INT2 in FIG. 2 or the integration circuit INT3 in FIG. 3. The integration circuit INT$a$ is an analog integration circuit. The integration circuit INT$b$ is a digital integration circuit.

In some embodiments, the digital to analog circuit DAC1 in FIG. 1 and the digital to analog circuit DAC3 in FIG. 3 includes switches (not shown) respectively, so as to control the selection of the received signal of the digital to analog circuit DAC1 of FIG. 1 and the digital to analog circuit DAC3 of FIG. 3. For example, when operating or obtaining a calibration model by the first time, the digital to analog circuit DAC1 of FIG. 1 selects to receive the data signal S11 that has not passed the signal compensation device 110A, and the digital to analog circuit DAC3 of FIG. 3 selects to receive the data signal S23 that has not passed the signal compensation device 110C. On the other hand, when actually transmitting the data signal to be output, the digital to analog circuit DAC1 of FIG. 1 selects to receive the data signal S11 that passes through the signal compensation device 110A, and the digital to analog circuit DAC3 of FIG. 3 selects to receive the data signal S23 that passes through the signal compensation device 110C.

In some embodiments, when the transmitted and received data signals are audio signals, the signal transceivers 100, 200, and 300 as shown in FIG. 1 to FIG. 3 do not include the mixing circuits M1 and M2. That is, when the transmitted and received data signals are audio signals, it is not necessary to process through the mixing circuits M1 and M2.

In summary, the signal compensation device provided in the embodiments of the present disclosure linearizes the emitter and the receiver by using a sigma-delta modulation circuit. Compared with the existing signal compensation method, the embodiments of the present disclosure may reduce the computational complexity and the power consumption is less.

In addition, the above illustrations comprise sequential demonstration operations, but the operations need not be performed in the order shown. The execution of the operations in a different order is within the scope of this disclosure. In the spirit and scope of the embodiments of the present disclosure, the operations may be increased, substituted, changed and/or omitted as the case may be.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A signal compensation device, comprising:
   an operation circuit, configured to generate a control signal according to a first data signal and a second data signal, wherein the second data signal is generated according to the first data signal by a signal conversion circuit; and
   a sigma-delta modulation circuit, configured to modulate the first data signal using a loop gain according to the control signal to compensate an attenuation of the signal conversion circuit;
   wherein the signal conversion circuit comprises a transmitter conversion circuit and a receiver conversion circuit, and the transmitter conversion circuit is configured to receive the first data signal and the modulated first data signal.

2. The signal compensation device of claim 1, wherein the transmitter conversion circuit comprises:
   a digital to analog circuit, configured to convert the first data signal into an first analog data signal; and
   a power amplifying circuit, configured to amplify the first analog data signal.

3. The signal compensation device of claim 2, wherein the transmitter conversion circuit comprises:
   a low pass filter circuit, configured to filter the first analog data signal.

4. The signal compensation device of claim 2, wherein the transmitter conversion circuit comprises:
   a mixing circuit, configured to convert the first analog data signal from a low frequency signal to a high frequency signal.

5. The signal compensation device of claim 1, wherein the receiver conversion circuit comprises:
   an attenuation circuit, configured to receive an emitting data signal emitted from the transmitter conversion circuit, and perform a attenuation processing so as to generate a post attenuation signal;

an amplifying circuit, configured to amplify the post attenuation signal to generate an analog data signal; and an analog to digital circuit, configured to convert the analog data signal into a digital data signal, so as to generate the second data signal.

6. The signal compensation device of claim 5, wherein the receiver conversion circuit further comprises:

a mixing circuit, configured to adjust the post attenuation signal from high frequency to low frequency.

7. The signal compensation device of claim 1, wherein the sigma-delta modulation circuit comprises:

an addition and subtraction operation circuit;

an integration circuit, coupled to the addition and subtraction operation circuit;

a quantization circuit, coupled to the integration circuit; and a control circuit, coupled to the quantization circuit and the addition and subtraction operation circuit, to form a feedback path.

8. The signal compensation device of claim 7, wherein the integration circuit is a digital integration circuit.

9. The signal compensation device of claim 7, wherein the integration circuit is an analog integration circuit.

10. The signal compensation device of claim 1, wherein the sigma-delta modulation circuit is coupled to the transmitter conversion circuit.

11. The signal compensation device of claim 1, wherein the sigma-delta modulation circuit is coupled to the receiver conversion circuit.

12. The signal compensation device of claim 1, wherein the operation circuit is further configured to divide the second data signal by the first data signal, so as to generate the control signal.

* * * * *